(12) United States Patent
Yang et al.

(10) Patent No.: US 7,616,089 B2
(45) Date of Patent: Nov. 10, 2009

(54) COMPENSATION OF FIELD EFFECT ON POLYCRYSTALLINE RESISTORS

(75) Inventors: Hua Yang, Austin, TX (US); Ammisetti Prasad, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 147 days.

(21) Appl. No.: 11/864,480

(22) Filed: Sep. 28, 2007

(65) Prior Publication Data

US 2009/0085657 A1    Apr. 2, 2009

(51) Int. Cl.
*H01C 13/02*   (2006.01)
*H01L 43/00*   (2006.01)
*H01L 43/06*   (2006.01)
*H01L 43/08*   (2006.01)

(52) U.S. Cl. .................. 338/32 H; 257/536; 257/537; 257/538; 330/75; 338/32 R; 338/295

(58) Field of Classification Search ......... 257/536–538; 330/75; 338/32, 295
See application file for complete search history.

(56) References Cited

U.S. PATENT DOCUMENTS 6,911,896 B2 * 6/2005 Nicholson et al. ........... 338/260

2006/0027894 A1 * 2/2006 Harada ....................... 257/538
2008/0278213 A1 * 11/2008 Morini ....................... 327/344

FOREIGN PATENT DOCUMENTS

JP     2000150778 A  *  5/2000
WO    WO 23777 A1   *  4/2000

* cited by examiner

*Primary Examiner*—Marcos D. Pizarro
*Assistant Examiner*—Raj Gupta
(74) *Attorney, Agent, or Firm*—Brian F. Russell; Dillon & Yudell LLP

(57) ABSTRACT

A resistive circuit includes a first terminal and a second terminal and polycrystalline first and second resistive segments coupled between the first and second terminals. A third terminal A is coupled to the first resistive segment, and a third terminal B is coupled to the second resistive segment. The third terminal A has a first voltage with respect to the first terminal, and the third terminal B has a second voltage with respect to the second terminal. With this arrangement, the non-linearity of resistance of the first resistive segment at least partially compensates for non-linearity of resistance of the second resistive segment.

9 Claims, 9 Drawing Sheets

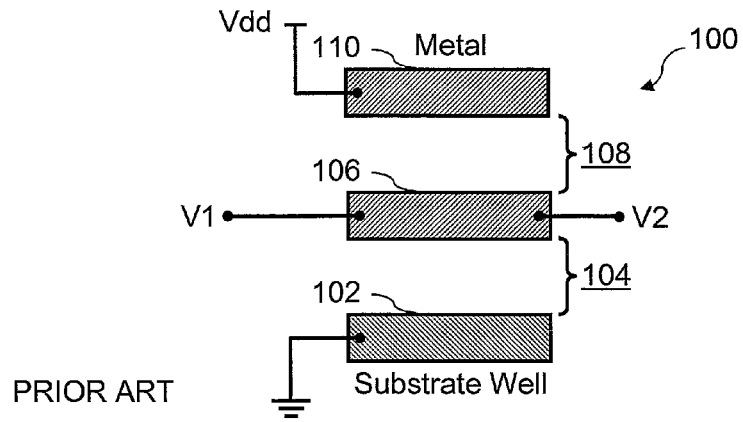
Figure 1A
PRIOR ART
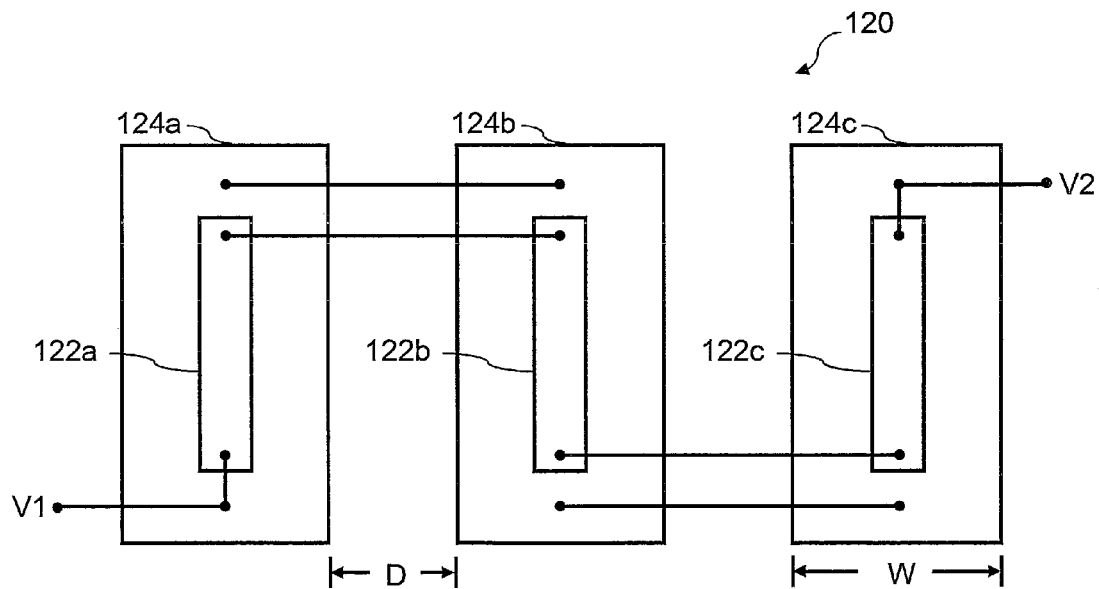
PRIOR ART     Figure 1B

COMPENSATION OF FIELD EFFECT ON POLYCRYSTALLINE RESISTORS

BACKGROUND OF THE INVENTION

1. Technical Field

The present invention relates in general to electrical circuitry, and more particularly, to the compensation of field effect on polycrystalline resistors.

2. Description of the Related Art

It is well known in the art of analog integrated circuitry that the resistance of polycrystalline silicon (also referred to as polysilicon, poly-Si or simply poly) varies with the applied voltage in a non-linear fashion in the presence of an electric field. This non-linearity is caused by an accumulation of carriers (and thus reduced resistance) in the presence of a positive electric field, or conversely, by a depletion of carriers (and thus increased resistance) in the presence of a negative electric field. Additional information regarding the non-linearity of polycrystalline silicon resistors can be found, for example, in Sze, S. M., Physics of Semiconductor Devices, $2^{nd}$ Ed., pp. 362-366.

Because such non-linearity is undesirable in many applications, some conventional analog integrated circuits include features intended to reduce the non-linearity of polycrystalline resistors. FIG. 1A is a section view of a first prior art analog integrated circuit 100 that partially compensates for the non-linearity of a polycrystalline resistor. As shown, analog integrated circuit 100 includes a substrate well 102 coupled to ground, a polycrystalline resistor 106 over substrate well 102, and a metallization layer 110 over polycrystalline resistor 106 that is coupled to Vdd. A first oxide layer 104 is interposed between substrate well 102 and polycrystalline resistor 106, and a second oxide layer 108 is interposed between polycrystalline resistor 106 and metallization layer 110. As is well known to those skilled in the art, oxide layers 104, 108 are dielectric layers that electrically isolate polycrystalline resistor 106 from metallization layer 110 and substrate well 102.

Because metallization layer 110 and substrate well 102 are coupled to different potentials and accordingly have an electric field there between, the non-linearity of polycrystalline resistor 106 is reduced by partial cancellation of the field effect on polycrystalline resistor 106. However, in practice, cancellation of the field effect in analog integrated circuit 100 is only partially successful because of asymmetry in the signal between Vdd and ground and differences in the thicknesses of oxide layers 104, 108 militated by other aspects of the design. In addition, circuit layout considerations often make it difficult to overlay each polycrystalline resistor 106 with a metallization layer 110.

FIG. 1B is a top plan view of a second prior art analog integrated circuit 120 that substantially cancels the field effect on a polycrystalline resistor by employing a "bootstrapped" resistor design. Analog integrated circuit 120 includes one or more series-connected polycrystalline segments 122a-122c, which are each connected in parallel with a respective one of underlying well resistor(s) 124a-124c. Well resistors 124a-124c are characterized by a well width W and a well-to-well distance D.

Although the bootstrapped resistor design employed in the embodiment of FIG. 1B can be effective in avoiding non-linear variations in resistivity to a first order approximation, both the well width W and well-to-well distance D are typically large, meaning that the use of bootstrapped resistors is inefficient in terms of die area (and therefore cost). Additional die area and power may also be consumed by a buffer required to drive the well resistors.

SUMMARY OF THE INVENTION

The present invention provides improved apparatus, systems and methods. According to one embodiment, a resistive circuit includes a first terminal and a second terminal and polycrystalline first and second resistive segments coupled between the first and second terminals. A third terminal A is coupled to the first resistive segment, and a third terminal B is coupled to the second resistive segment. The third terminal A has a first voltage with respect to the first terminal, and the third terminal B has a second voltage with respect to the second terminal. With this arrangement, the non-linearity of resistance of the first resistive segment at least partially compensates for non-linearity of resistance of the second resistive segment.

All objects, features, and advantages of the present invention will become apparent in the following detailed written description.

BRIEF DESCRIPTION OF THE DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings in which like and corresponding reference numerals identify like and corresponding reference numerals, wherein:

FIG. 1A is a section view of a first resistor circuit in accordance with the prior art;

FIG. 1B is a top plan view of a second resistor circuit in accordance with the prior art;

DETAILED DESCRIPTION OF ILLUSTRATIVE EMBODIMENT

Figure 2:
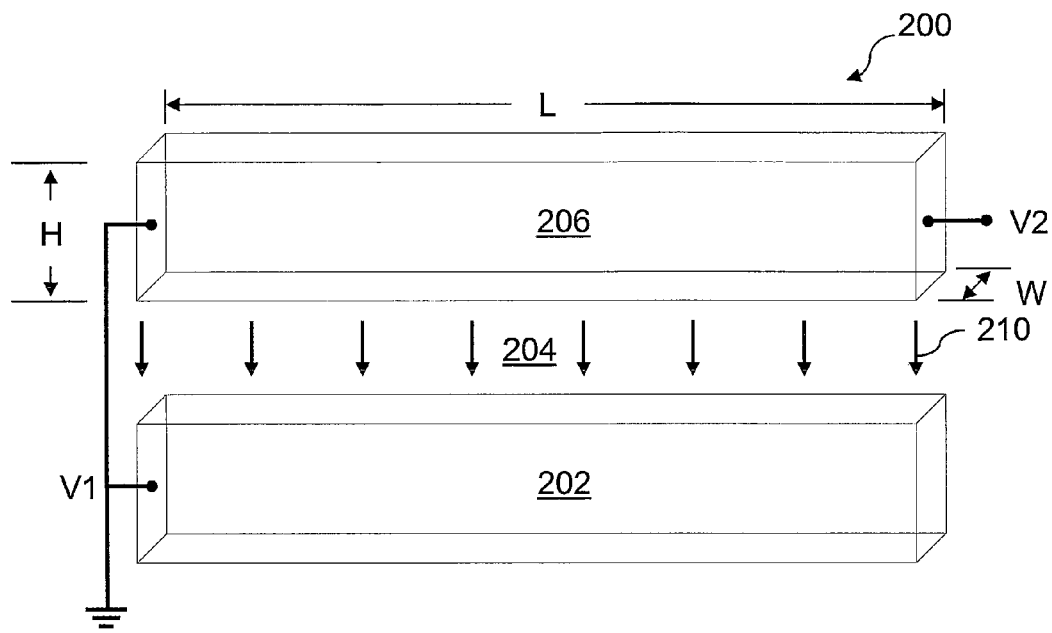
FIG. 2 depicts an isometric view of an idealized polycrystalline resistor circuit.

With reference now to FIG. 2, there is depicted an isometric view of an idealized integrated circuit resistor 200. As shown, integrated circuit resistor 200 includes a substrate well 202 coupled to ground, an isolation layer 204 overlying substrate well 202, and a polycrystalline silicon segment 206 overlying isolation layer 204. Polycrystalline silicon segment 206, which is a rectangular prism characterized by a length L, height H, and width W, is coupled between first voltage terminal having voltage V1 and a second voltage terminal having voltage V2, where voltage V1 is a reference voltage such as ground and voltage V2>voltage V1. It will be appreciated that in practice, length L of polycrystalline silicon segment 206 is not merely the minimum linear distance between the two voltage terminals, but is instead the total length through the polycrystalline silicon that current flows between the voltage terminals.

The potential difference between polycrystalline silicon segment 206 and substrate well 202 generates an electric field 210 that varies in magnitude along length L of polycrystalline silicon segment 206. Because the resistivity of polycrystalline silicon segment 206 varies with the electric field magnitude, the resistivity at any given point x along length L of polycrystalline silicon segment 206 can be expressed as a function of the magnitude of the electric field E as follows:

$$\rho(x)=f(\overline{E}).$$

Given the high doping concentrations that are typical of semiconductor fabrication (e.g., $10^{20}/cm^3$), $f(\overline{E})$ can be expressed via Taylor series expansion as follows:

$$\rho(x)=f(\overline{E})=\rho_o(1+\overline{B}\cdot\overline{E}(x)+\Sigma),$$

where $\rho$ is the bulk resistivity of the polycrystalline silicon, $\overline{B}$ is a fabrication process-dependent constant, and $\Sigma$ represents the high order Taylor series expansion terms that can be neglected given the assumption of a high doping concentration. If the high order terms are neglected, the expression for resistivity can be simplified as follows:

$$\rho(x)\approx\rho_o(1+\overline{B}\cdot\overline{E}(x)).$$

Utilizing this approximation, the resistance R of polycrystalline silicon segment 206 can be computed by integrating the resistivity of each differential unit of polycrystalline silicon segment 206 over its length L as follows:

$$R=\int_o^L \frac{\rho(x)}{H\cdot W}dx = \int_o^L \frac{\rho_o(1+\overline{B}\cdot\overline{E}(x))}{H\cdot W}dx.$$

If it is assumed that the electric field $\overline{E}$ exhibits linear variation over the length of polycrystalline silicon resistor 206, and can therefore be represented as:

$$\overline{E}(x)=kx\hat{e}$$

where x represents position, k is a constant and $\hat{e}$ is a vector representing electric field polarity, then the resistance R of polycrystalline silicon segment 206 can be restated as:

$$R=\int_o^L \frac{\rho_o(1+\overline{B}\cdot k\cdot x\cdot \hat{e})}{H\cdot W}dx = \frac{\rho_o L}{HW}+\int_o^L \frac{\rho_o L}{HW}kx\overline{B}\hat{e}dx.$$

Solving the integral yields:

$$R=\frac{\rho_o L}{HW}+\frac{\rho_o k}{HW}\frac{L^2}{2}\overline{B}\hat{e}=\frac{\rho_o L}{HW}+\frac{L^2\rho_o}{2HW}k\overline{B}\hat{e}$$

as the $1^{st}$ order approximation of the resistance R of polycrystalline silicon segment 206.

Given the foregoing approximation of resistance R, it is apparent that variations in resistance R are primarily due to the polarity of the electric field. Consequently, the present invention appreciates that compensation for the field effect on a given polycrystalline resistor can be achieved by segmenting the polycrystalline resistor into multiple resistive segments and by applying electric fields of opposite polarities to the resistive segments.

Figure 3A:
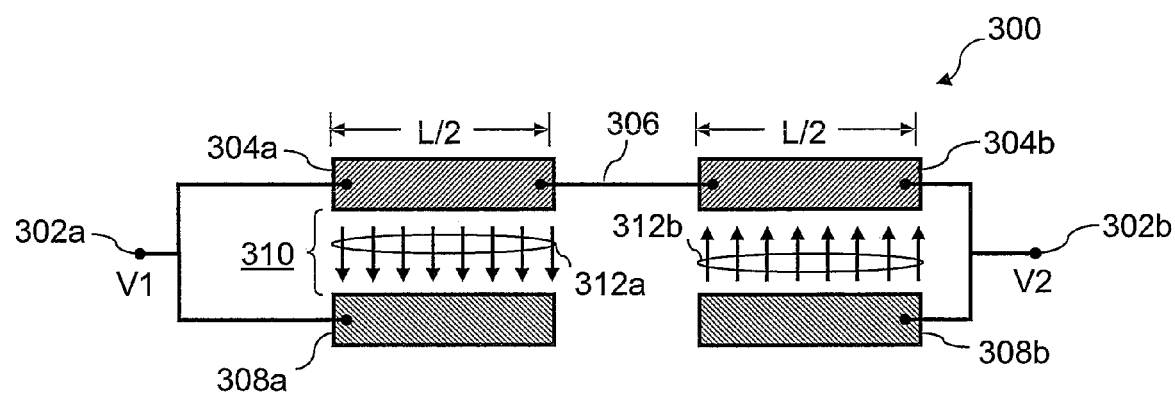
FIG. 3A illustrates a first embodiment of a resistive circuit in accordance with the present invention.

Referring now to FIG. 3A, there is illustrated a section view of a first embodiment of a resistive circuit 300 in accordance with the present invention. As depicted, resistive circuit 300 includes a first terminal 302a characterized by voltage V1 and a second terminal 302b characterized by voltage V2, where voltage V2>voltage V1. Coupled between terminals 302a, 302b are multiple (in this case, two) resistive segments 304a, 304b formed of polycrystalline silicon or other resistive material subject to non-linear behavior when subjected to an electric field. Resistive segments 304 are spaced apart from one another and electrically coupled to each other, in this case in series, by a conductor 306, such as a metal.

Resistive circuit 300 further includes multiple third terminals 308a, 308b equal in number to the number of resistive segments 304. Each third terminal 308 is coupled at one end to an end of a respective resistive segment 304, in this case at one of first and second terminals 302a, 302b. That is, third terminal 308a is coupled to an end of a resistive segment 304a at first terminal 302a, and third terminal 308b is coupled to an end of a resistive segment 304b at second terminal 302b. Third terminals 308 are separated from resistive segments 304 by an isolation region 310. Substantially no DC current flows in third terminals 308.

By virtue of the connections of third terminals 308a, 308b to first and second terminals 302a, 302b, respectively, third terminal 308a has a first voltage with respect to first terminal 302a and therefore applies to first resistive segment 304a a first electric field 312a having a first polarity. Third terminal 308b has a second voltage with respect to second terminal 302B and therefore applies to second resistive segment 304b a second electric field 312b having an opposite second polarity. Consequently, the variation in impedance in resistive segment 304a due to the presence of an electric field 312a is offset by the variation in impedance in resistive segment 304b due to the presence of electric field 312b. Assuming the number of resistive segments 304 is an even integer and the lengths of each pair of resistive segments 304a, 304b are equal as shown, the cumulative resistance of the overall resistive circuit 300 will be linear at least to a first order approximation despite the non-linearity of the resistances of the individual resistive segments 304. Of course, even if the lengths of each pair of resistive segments 304a, 304b are not precisely equal but are only approximately equal (e.g., differ up to 20 or 30 percent), significant compensation for the non-linearity of resistive circuit 300 will still be achieved.

Resistive circuit 300 of FIG. 3A is only one of a large number of embodiments of resistive circuits that may be implemented in accordance with the present invention. For example, in a typical analog integrated circuit implementation, third terminals 308 are formed of metal, polycrystalline or a substrate well, isolation region 310 is formed of a dielectric material, such as silicon dioxide, that overlays third terminals 308, and resistive segments 304 are formed of polycrystalline. However, it should be appreciated from the present disclosure that numerous alternative embodiments, including those not realized in integrated circuitry, are possible and included within the scope of the appended claims. In such alternative embodiments, numerous variations in materials and physical interrelationships of features are possible. For example, the material employed for the segmented third terminal can be any material capable of applying an electric field to the resistive segments, including, without limitation, the casing or packaging of a discrete resistor. Similarly, the isolation region can be implemented, without limitation, with a polymer or a gas phase material, such as air. In addition, the third terminals are not limited in position to underlying the resistive segments (as shown, for example, in FIG. 3A), but can instead be realized in any relation to the resistive segments in three-dimensional space.

Figure 3B:
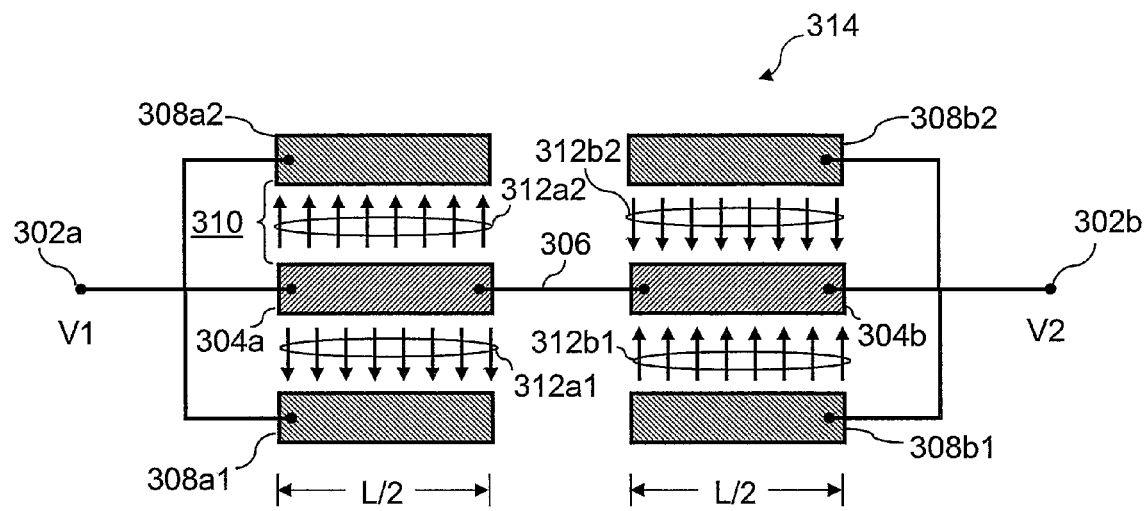
FIG. 3B depicts a second embodiment of a resistive circuit in accordance with the present invention.

FIG. 3B depicts a second embodiment of a resistive circuit 314 in accordance with the present invention. The embodiment of FIG. 3B is identical to that of FIG. 3A, except that the embodiment of FIG. 3B includes multiple third terminals for each resistive segment 304. That is, third terminals 308a1 and 308a2 apply positive electric fields 312a1 and 312a2 to resistive segment 304a, and third terminals 308b1 and 308b2 apply negative electric fields 312b1 and 312b2 to resistive segment 304b. It will be appreciated that not all third terminals for a resistive circuit are required to be formed of the same material. For example, in some implementations, third terminals 308a1 and 308b1 are implemented as substrate wells, and some third terminals 308a2 and 308b2 are implemented with metallizations.

Figure 3C:
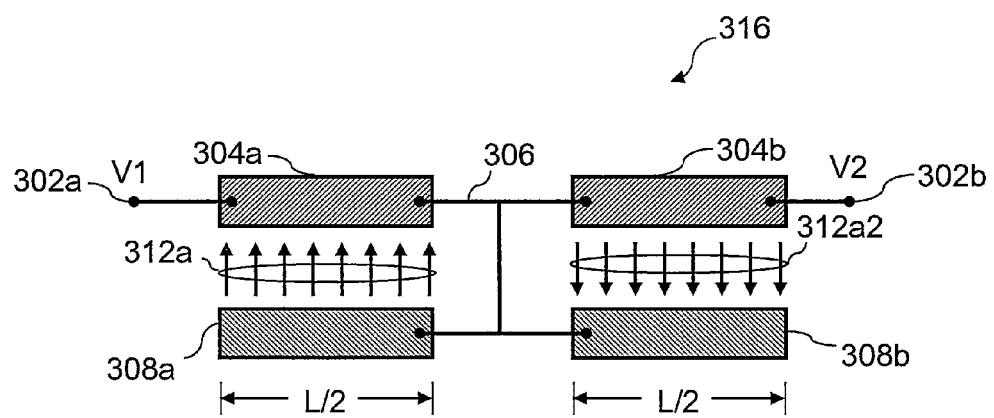
FIG. 3C illustrates a third embodiment of a resistive circuit in accordance with the present invention.

FIG. 3C illustrates a third embodiment of a resistive circuit 316 in accordance with the present invention. The embodiment of FIG. 3C is similar to that of FIG. 3A, except that third terminals 308a, 308b are directly connected to one another and are each electrically connected to the ends of resistive segments 304a, 304b distal from terminal 302a, 302b. As a result of this connection, third terminal 308a applies a negative electric field to resistive segment 304a, and third terminal 308b applies a positive electric field to resistive segment 304b.

Figure 3D:
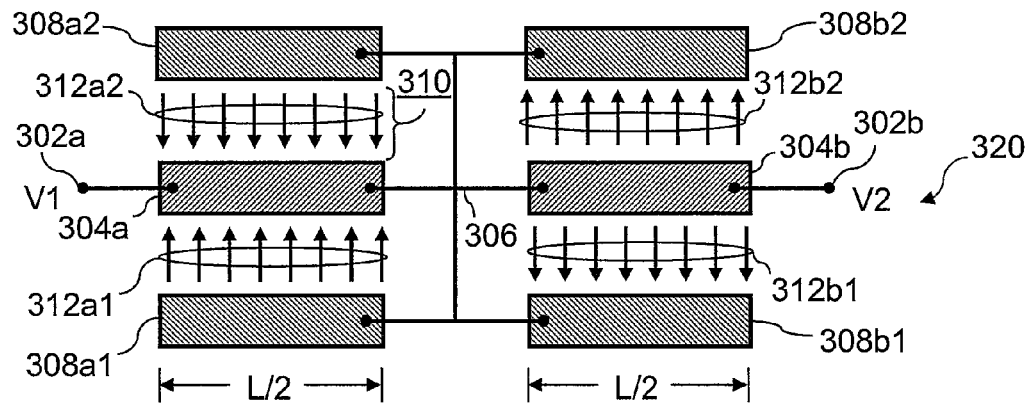
FIG. 3D illustrates a fourth embodiment of a resistive circuit in accordance with the present invention.

FIG. 3D illustrates a fourth embodiment of a resistive circuit 320 in accordance with the present invention. The fourth embodiment of FIG. 3D employs a central connection of the segmented third terminal to the resistive segments similarly to the embodiment of FIG. 3C, but includes multiple third terminals for each resistive segment 304 as described above with reference to FIG. 3B. As depicted, third terminals 308a1 and 308a2 apply negative electric fields 312a1 and 312a2 to resistive segment 304a, and third terminals 308b1 and 308b2 apply positive electric fields 312b1 and 312b2 to resistive segment 304b. All of third terminals 308a1, 308a2, 308b1 and 308b2 are centrally connected by conductor 306.

Figure 3E:
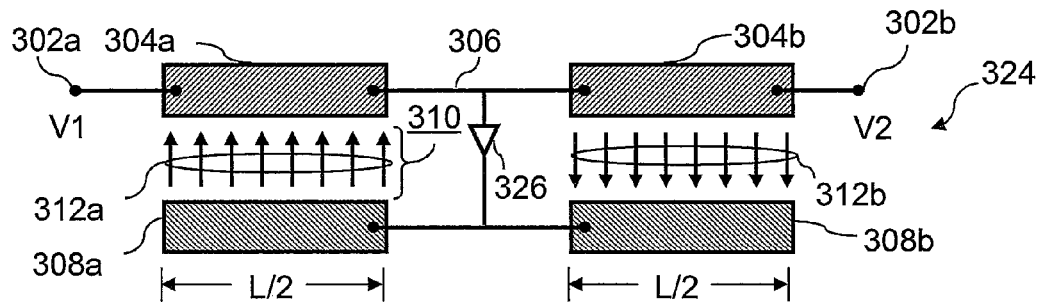
FIG. 3E depicts a fifth embodiment of a resistive circuit in accordance with the present invention.

FIG. 3E depicts a fifth embodiment of a resistive circuit 324 in accordance with the present invention. The fifth embodiment of FIG. 3E employs a central connection of the segmented third terminal to the resistive segments similarly to the embodiment of FIG. 3C, but includes a buffer 326 coupled between conductor 306 and third terminals 308a, 308b in order to avoid losses due to current leakage from resistive segments 304a, 304b to third terminals 308a, 308b.

Figure 3F:
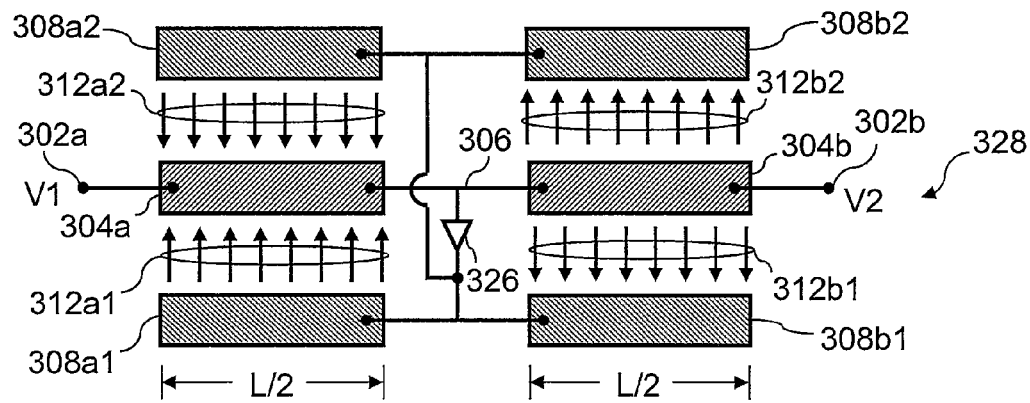
FIG. 3F illustrates a sixth embodiment of a resistive circuit in accordance with the present invention.

FIG. 3F illustrates a sixth embodiment of a resistive circuit 328 in accordance with the present invention. That sixth embodiment of FIG. 3F is similar to that of FIG. 3D, but includes a buffer 326 coupled between conductor 306 and third terminals 308a1, 308a2, 308b1, and 308b2 to avoid losses due to current leakage from resistive segments 304a, 304b to third terminals 308a1, 308a2, 308b1, and 308b2.

Figure 3G:
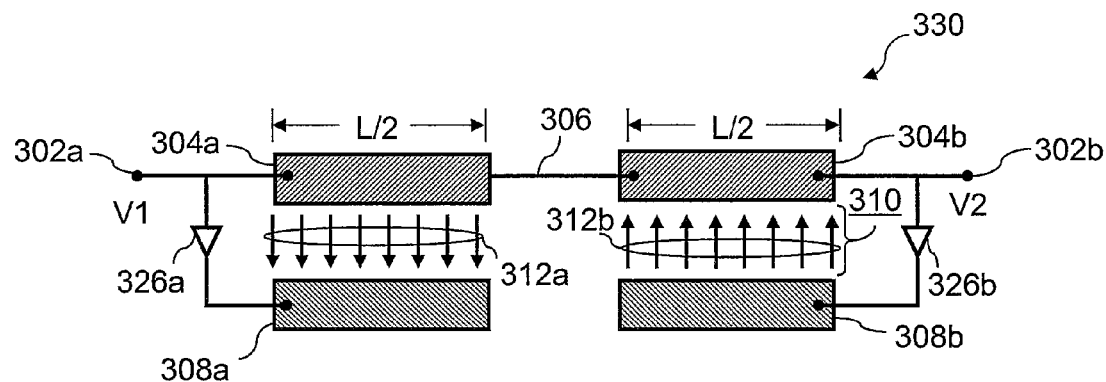
FIG. 3G depicts a seventh embodiment of a resistive circuit in accordance with the present invention.

FIG. 3G depicts a seventh embodiment of a resistive circuit 330 in accordance with the present invention. The seventh embodiment of FIG. 3G is similar to the first embodiment depicted in FIG. 3A, except that the seventh embodiment includes a buffer 326a coupled between resistive segment 304a and third terminal 308a and a buffer 326b coupled between resistive segment 304b and third terminal 308b in order to avoid losses due to leakage currents.

Figure 3H:
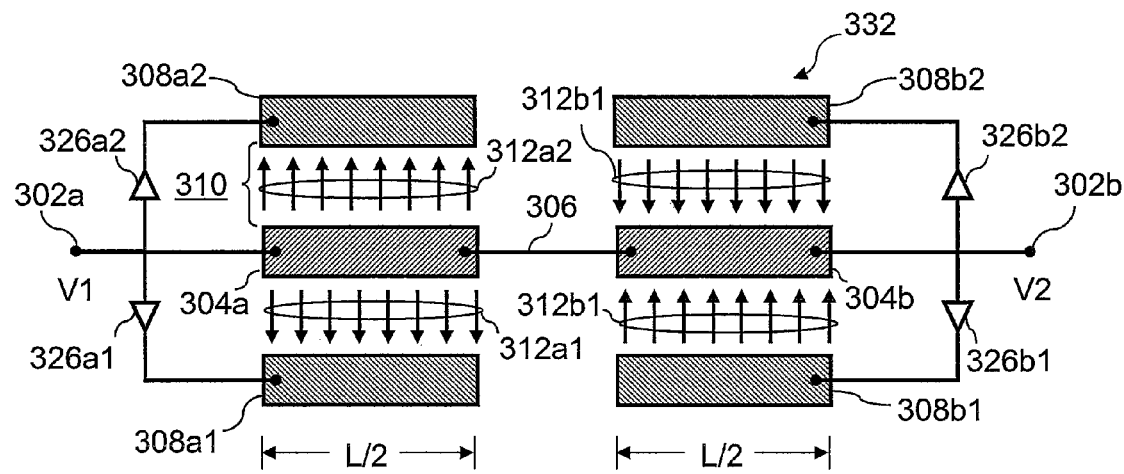
FIG. 3H illustrates an eighth embodiment of a resistive circuit in accordance with the present invention.

FIG. 3H illustrates an eighth embodiment of a resistive circuit 332 in accordance with the present invention. The eighth embodiment of FIG. 3H is similar to the second embodiment shown in FIG. 3B, except that the eighth embodiment includes a respective one of buffers 326a1 and 326a2 coupled between resistive segment 304a and third terminals 308a1 and 308a2 and further includes a respective one of buffers 326b1 and 326b2 coupled between resistive segment 304b and third terminals 308b1 and 308b2 in order to avoid losses due to leakage currents.

Figure 3I:
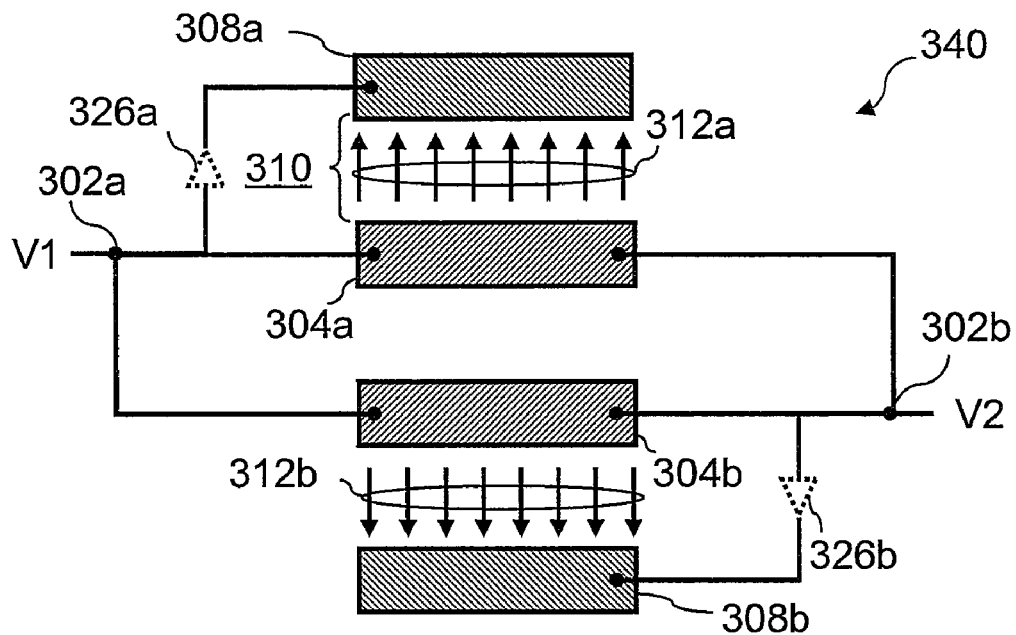
FIG. 3I illustrates a ninth embodiment of a resistive circuit in accordance with the present invention.

Referring now to FIG. 3I, there is depicted a section view of a ninth embodiment of a resistive circuit 340 in accordance with the present invention. As depicted, resistive circuit 300 includes a first terminal 302a characterized by voltage V1 and a second terminal 302b characterized by voltage V2, where voltage V2>voltage V1. Coupled in parallel between terminals 302a, 302b are multiple (in this case, two) resistive segments 304a, 304b formed of polycrystalline silicon or other resistive material subject to non-linear behavior when subjected to an electric field. Resistive segments 304 are spaced apart from one another.

Resistive circuit 340 further includes multiple third terminals 308a, 308b equal in number to the number of resistive segments 304. Each third terminal 308 is coupled at one end to an end of a respective resistive segment 304, in this case at one of first and second terminals 302a, 302b. That is, third terminal 308a is coupled to an end of a resistive segment 304a at first terminal 302a, and third terminal 308b is coupled to an end of a resistive segment 304b at second terminal 302b. Third terminals 308 are separated from resistive segments 304 by an isolation region 310. Substantially no DC current flows in third terminals 308, and leakage currents can be reduced by implementing one of optional buffers 326a and 326b between each resistive segment 304a, 304b and its respective third terminal 308a, 308b.

By virtue of the connections of third terminals 308a, 308b to first and second terminals 302a, 302b, respectively, third terminal 308a has a first voltage with respect to first terminal 302a and therefore applies a first electric field 312a to first resistive segment 304a, and third terminal 308b has a second voltage with respect to second terminal 302b and applies a second electric field 312b having a same polarity to second resistive segment 304b. Consequently, the variation in impedance in resistive segment 304a due to the presence of an electric field 312a is offset by the variation in impedance in resistive segment 304b due to the presence of electric field 312b.

In contrast to the series-connected embodiments of FIGS. 3A-3H described above, embodiments in which the resistive segments are connected in parallel generally do not achieve full compensation for non-linearity, but nevertheless can still achieve significant compensation (e.g., up to approximately 90%).

Figure 4:
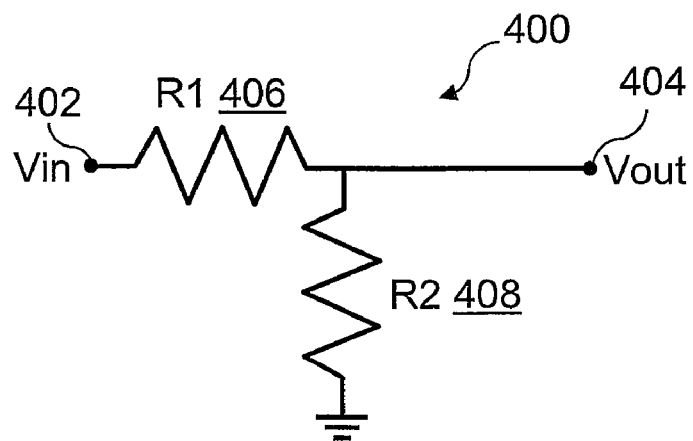
FIG. 4 depicts a voltage divider circuit in which resistive circuits in accordance with the present invention may be utilized.

Resistive circuits in accordance with the present invention not only are capable of implementation in a number of different embodiments, as demonstrated above, but also are susceptible to a wide variety of circuit applications. For example, FIG. 4 depicts a voltage divider circuit 400 in which resistive circuits in accordance with the present invention may be utilized. Voltage divider circuit 400 includes a resistor R1 406 coupled between input terminal 402 and output terminal 404 and a resistor R2 408 coupled between output terminal 404 and ground. With this configuration, the output voltage $V_{out}$ is related to $V_{in}$ as follows:

$$V_{out} = \frac{R_2}{R_1 + R_2} \cdot V_{in}$$

A resistive circuit in accordance with the present invention can be utilized to implement resistor R1 406 and/or resistor R2 408.

In addition, resistive circuits in accordance with the present invention can be applied to any of the wide number of amplifier circuits containing impedances, including those shown in FIGS. 5A-5D. In these figures, explicit depiction of the third terminals is omitted to avoid obscuring the structure of the circuits.

Figure 5A:
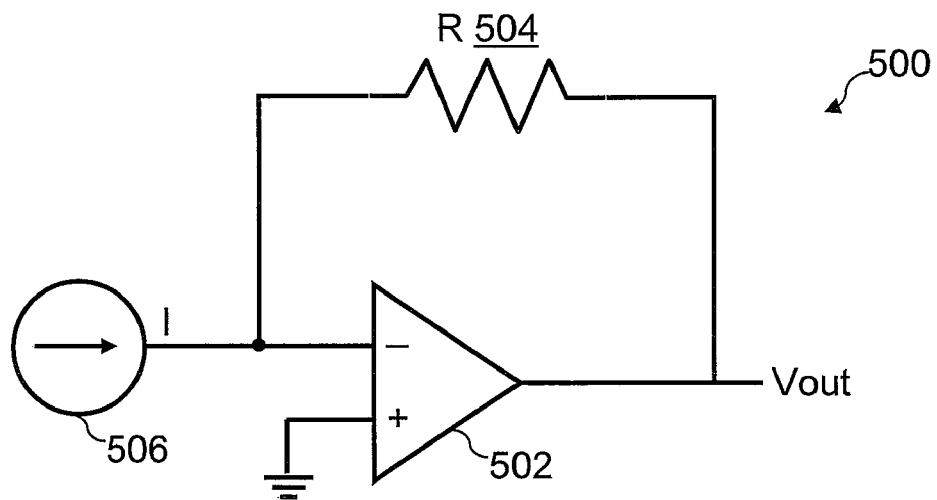
FIG. 5A illustrates a current-to-voltage converter in which a resistive circuit in accordance with the present invention may be utilized.

Referring first to FIG. 5A, there is depicted a current-to-voltage conversion circuit 500 having a resistor 504 that can be implemented utilizing a resistive circuit in accordance with the present invention. As shown, current-to-voltage conversion circuit 500 includes an amplifier 502 having a feedback resistor 504 coupled between its output and negative input, a current source 506 coupled to provide a current I to the negative input of amplifier 502, and a ground voltage reference coupled to the positive input of amplifier 502. The output voltage Vout of amplifier 502 is given by the following equation:

Vout=I×R

As will be appreciated from the above equation, both the linearity and the absolute value of the resistor are important in obtaining the correct output voltage Vout.

Figure 5B:
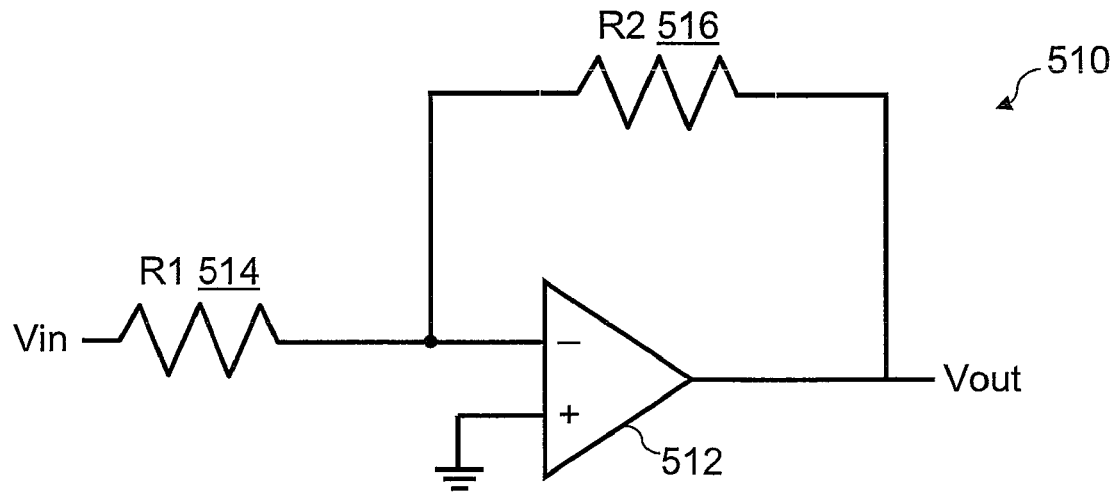
FIG. 5B depicts an inverting gain amplifier circuit in which a resistive circuit in accordance with the present invention may be utilized.
Figure 5C:
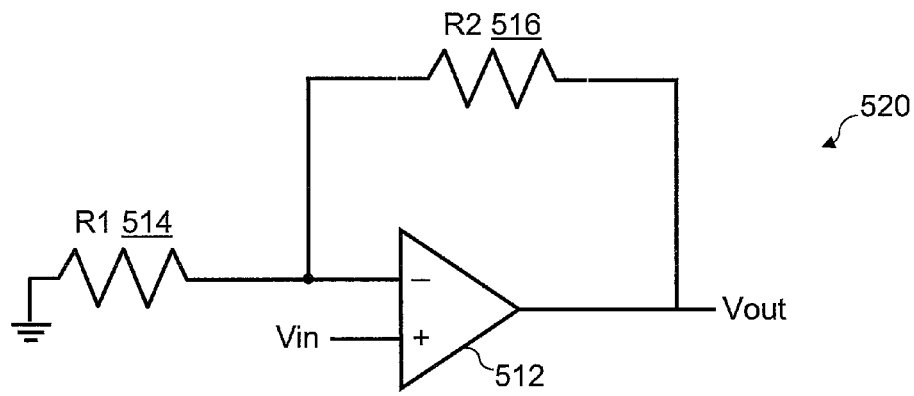
FIG. 5C illustrates a non-inverting gain amplifier circuit in which a resistive circuit in accordance with the present invention may be utilized.

FIGS. 5B and 5C respectively illustrate an inverting gain amplifier circuit 510 and a non-inverting gain amplifier circuit 520 that employ resistive circuits in accordance with the present invention. Each of amplifier circuits 510 and 512 includes an amplifier 512 having a feedback resistor R2 516 coupled between its output and negative input and a resistor R1 514 coupled to the negative input of amplifier 502. In inverting gain amplifier circuit 510, resistor R1 514 is coupled to receive input voltage Vin, and the positive input of amplifier 512 is coupled to ground. Given this configuration, output voltage Vout for inverting gain amplifier circuit 510 is given as follows:

$$Vout = -V_{in} \cdot \frac{R_2}{R_1}$$

In non-inverting gain amplifier circuit 520, the connection of amplifier inputs is reversed, with resistor R1 514 being coupled to ground, and the positive input of amplifier 512 being coupled to receive input voltage Vin. With this configuration, output voltage Vout for non-inverting gain amplifier circuit 520 is given as:

$$Vout = V_{in}\left(1 + \frac{R_2}{R_1}\right)$$

As described above, a resistive circuit in accordance with the present invention can be utilized to implement resistor R1 514 and/or resistor R2 516.

Figure 5D:
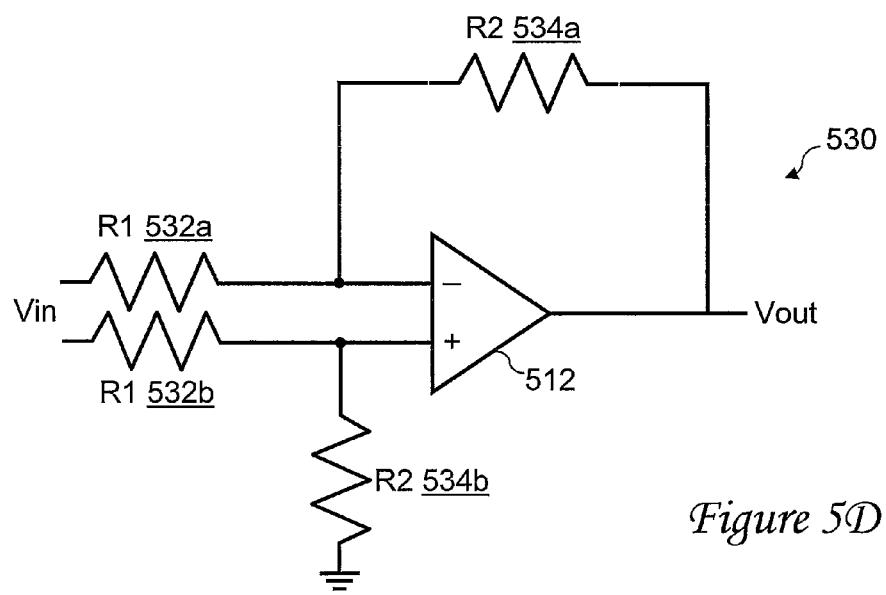
FIG. 5D depicts a difference amplifier circuit in which a resistive circuit in accordance with the present invention may be utilized.

A resistive circuit in accordance with the present invention can also be utilized to implement any resistor within a difference amplifier circuit such as that shown in FIG. 5D. Difference amplifier circuit 530 of FIG. 5D includes an amplifier 512 having a feedback resistor R2 534a coupled between its output and negative input and a resistor R1 532a coupled between the negative input of amplifier 512 and one side of input voltage Vin. Difference amplifier circuit 530 of FIG. 5D further includes a resistor R1 532b coupled between the positive input of amplifier 512 and a second side of input voltage Vin. A resistor R2 534b is coupled between the positive input of amplifier 512 and ground. The differential input voltage Vin presented to resistors R1 532a and 532b is amplified to obtain output voltage Vout according to the following equation:

$$Vout = V_{in} \cdot \frac{R_2}{R_1}$$

It will be appreciated that difference amplifier 530 can be utilized as a non-inverting amplifier by grounding the input of resistor R1 532a.

In the embodiments of resistive circuits described above, each pair of resistive segments has been described as comprising resistive segments of approximately the same length (e.g., L/2). However, according to present invention, compensation for the field effect on polycrystalline resistors can also be achieved in circuits having multiple resistors (e.g., amplifier circuits 510, 520 and 530 of FIGS. 5B-5D) by appropriate selection of the dimensions of resistive segments of differing sizes. To mathematically demonstrate compensation for the field effect in such cases, the following first order approximation of the resistance R of a polycrystalline resistor will be recalled from the preceding discussion:

$$R = \frac{\rho_o L}{HW} + \frac{L^2 \rho_o}{2HW} k \overline{B} \hat{e}$$

where H is height, W is width, L is length, $\rho_o$ is bulk resistivity of the polycrystalline silicon. Given that k is a constant equal to the voltage applied to the resistor divided by the length L $$\left(\text{i.e., } \frac{\Delta v}{L}\right),$$

the above equation can be rewritten as follows:

$$R = \frac{\rho_o L}{HW} + \frac{L^2 \rho_o}{2HW} \frac{\Delta v}{L} \overline{B} \hat{e} = \frac{\rho_o L}{HW} + \frac{L \rho_o}{2HW} \Delta v \overline{B} \hat{e}$$

Figure 5E:
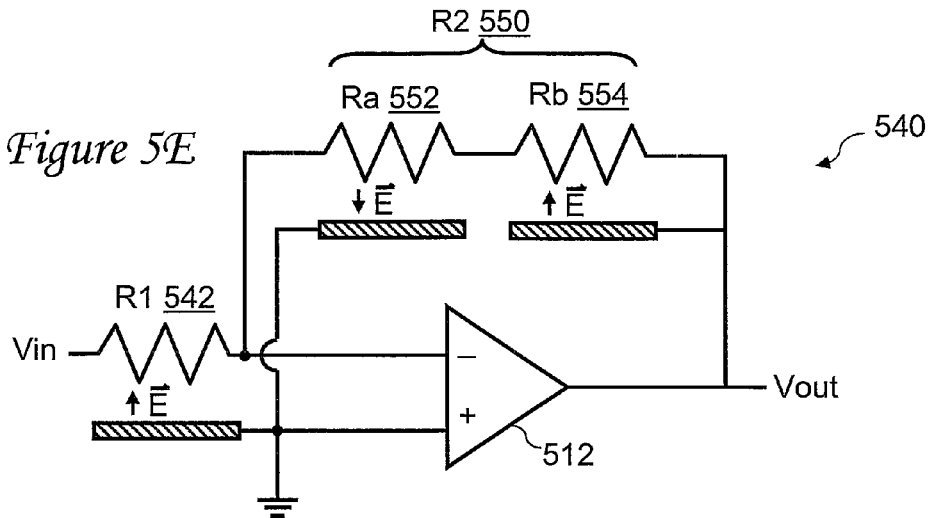
FIG. 5E illustrates an inverting gain amplifier circuit in which a resistive segments of differing lengths are utilized.

Consider now the inverting gain amplifier 540 shown in FIG. 5E, which includes an amplifier 512, a polycrystalline feedback resistor R2 550 comprising resistive segments Ra 552 and Rb 554, and a polycrystalline input resistor R1 542 coupled between input voltage Vin and the negative input of amplifier 540. In the depicted embodiment, feedback resistor R2 550 and resistor R1 542 are implemented similarly to the embodiment of FIG. 3A, except that resistive segments Ra 552 and Rb 554 are of unequal lengths, and resistor R1 542 is formed of a single resistive segment. As depicted, the third terminals of resistive segment Ra 552 and of input resistor R1 542 are each coupled to ground, causing electric fields of the depicted polarities.

Utilizing the above equation, the resistances of each of input resistor R1 542 and resistive segments Ra 552 and Rb 554 can be expressed as follows:

$$R_1 = \frac{\rho_o L_1}{HW} + \frac{L_1 \rho_o}{2HW} Vin\overline{B}\hat{e}$$

$$R_a = \frac{\rho_o L_a}{HW} - \frac{L_a \rho_o}{2HW} \frac{L_a}{L_a + L_b} Vout\overline{B}\hat{e}$$

$$R_b = \frac{\rho_o L_b}{HW} + \frac{L_b \rho_o}{2HW} \frac{L_b}{L_a + L_b} Vout\overline{B}\hat{e}$$

Thus, the total resistance of feedback resistor R2 550 can be expressed as a sum as follows:

$$R_a + R_b = \frac{\rho_o L_a}{HW} + \frac{\rho_o L_b}{HW} + \frac{\rho_o L_b}{2HW} \frac{L_b}{L_a + L_b} Vout\overline{B}\hat{e} -$$
$$\frac{\rho_o L_a}{2HW} \frac{L_a}{L_a + L_b} Vout\overline{B}\hat{e}$$
$$= \frac{\rho_o (L_a + L_b)}{HW} + \frac{\rho_o (L_b - L_a)}{2HW} Vout\overline{B}\hat{e}$$

Remembering now that the output voltage for an inverting gain amplifier is given by:

$$Vout = -V_{in} \cdot \frac{R_2}{R_1},$$

the gain G of inverting gain amplifier 540 can be expressed as the ratio of R2 to R1 as follows:

$$G = \frac{R_2}{R_1}$$
$$= \frac{R_a + R_b}{R_1}$$
$$= \frac{\left[\frac{\rho_o(L_a + L_b)}{HW} + \frac{\rho_o(L_b - L_a)}{2HW} Vout\overline{B}\hat{e}\right]}{\frac{\rho_o L_1}{HW} + \frac{\rho_o L_1}{2HW} Vin\hat{e}\overline{B}}$$

This equation can be further reduced through cancellation of terms to the following expression:

$$G = \frac{\left[(L_a + L_b) + \frac{1}{2}(L_b - L_a) Vout\hat{e}\overline{B}\right]}{L_1 + \frac{1}{2} L_1 Vin\hat{e}\overline{B}}$$

$$= \frac{\left[\frac{(L_a + L_b)}{L_1} + \frac{1}{2} \frac{(L_b - L_a)}{L_1} Vout\hat{e}\overline{B}\right]}{1 + \frac{1}{2} L_1 Vin\hat{e}\overline{B}}$$

Because the resistance of each of resistive segments Ra 552 and Rb 554 is proportional to its length, this expression can alternatively be stated as follows:

$$G = \frac{R_a + R_b}{R_1}$$
$$= \frac{L_a + L_b}{L_1}$$
$$= \frac{\left[\frac{(L_a + L_b)}{L_1} + \frac{1}{2} \frac{(L_b - L_a)}{L_1} Vout\hat{e}\overline{B}\right]}{1 + \frac{1}{2} L_1 Vin\hat{e}\overline{B}}$$

Thus, $$\frac{L_a + L_b}{L_1}\left[1 + \frac{1}{2} Vin\hat{e}\overline{B}\right] = \frac{(L_a + L_b)}{L_1} + \frac{1}{2} \frac{(L_b - L_a)}{L_1} Vout\hat{e}\overline{B}$$

$$\frac{1}{2} \frac{L_a + L_b}{L_1} Vin\hat{e}\overline{B} = \frac{1}{2} \frac{(L_b - L_a)}{L_1} Vout\hat{e}\overline{B}$$

$$\frac{L_a + L_b}{L_1} Vin = \frac{L_a - L_b}{L_1} Vout$$

$$\frac{Vout}{Vin} = \frac{L_a + L_b}{L_b - L_a} = G = \frac{L_b + L_a}{L_1}$$

Therefore, to achieve first order compensation for the field effect on the polycrystalline resistors of an amplifier circuit, it is sufficient if the following equation is satisfied:

$$L_b - L_a = L_1,$$

assuming that electric fields of the same polarity are applied to resistive segment Rb 554 and input resistor R1 542 and that an electric field of the opposite polarity is applied to resistive segment Ra 552. For a non-inverting configuration, the same equation is applicable; however, it should be noted that complete compensation is achieved when $L_a=0$.

Thus, for amplifier and other circuits employing multiple polycrystalline resistors, compensation for the field effect can be achieved utilizing either or a combination of two techniques, namely, (1) the use of paired polycrystalline resistive segments of equal dimensions to which electric fields of opposite polarities are applied by a segmented third terminal and/or (2) the use of one or more polycrystalline resistive segments of appropriately selected dimensions to which specified electric fields are applied. To illustrate the use of these techniques in combination, FIG. 5F depicts an embodiment of a difference amplifier circuit that utilizes both of the techniques described herein to compensate for the field effect on polycrystalline resistors.

Figure 5F:
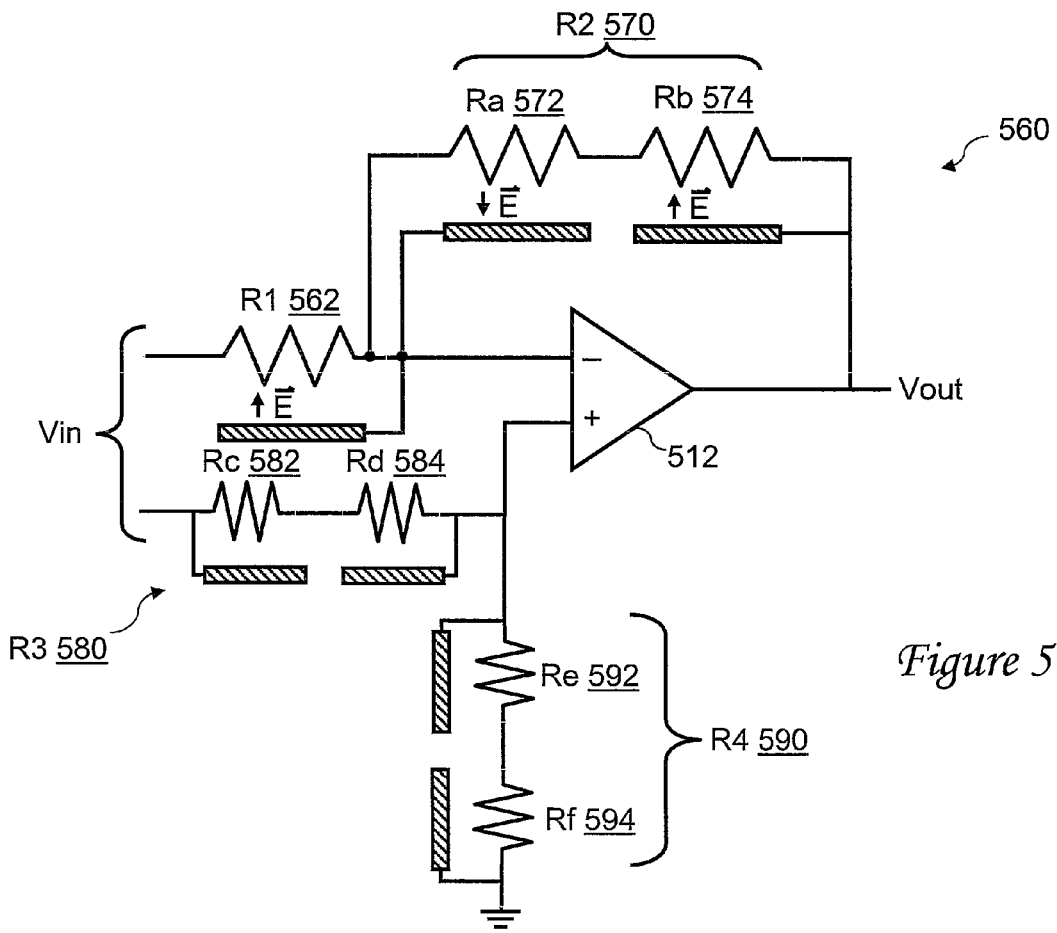
FIG. 5F depicts a difference amplifier circuit in which multiple techniques for compensating for the field effect on polycrystalline resistors are employed.

As shown in FIG. 5F, difference amplifier circuit 560 includes an amplifier 512 having a feedback resistor R2 570 coupled between its output and negative input. Feedback resistor R2 570 comprises polycrystalline resistive segments Ra 572 and Rb 574 and a respective associated third terminal for each resistive segment. Difference amplifier circuit 560 also includes an input resistor R1 562 coupled between the negative input of amplifier 512 and one side the input voltage Vin. Resistor R1 562 comprises a single polycrystalline resistive segment and an associated third terminal. According to the rule set forth above, the field effect on resistors R1 562 and R2 570 is compensated for by setting the length of resistor R1 equal to the difference in lengths of resistive segments Rb 574 and Ra 572 comprising resistor R2 570. Thus, compensation can be achieved utilizing fewer resistive segments and fewer third terminals than with the technique depicted in FIG. 3A.

Difference amplifier circuit 560 further includes an input resistor R3 580 coupled between the positive input of amplifier 512 and the second side of input voltage Vin, and difference amplifier circuit 560 also includes a resistor R4 590 coupled between the positive input of amplifier 512 and ground. In order to compensate for the field effect for resistors R3 580 and R4 590, each of resistors R3 580 and R4 590 is implemented as a pair of resistive segments (i.e., Rc 582, Rd 584, Re 592 and Rf 594) each having an associated third terminal, as described above with reference to FIGS. 3A-3H.

As has been described, the present invention provides improved apparatus, systems and methods for compensating for the field effect on resistors formed of polycrystalline material, such as polycrystalline silicon. In accordance with the present invention, the compensation achieved by a resistive circuit in accordance with the present invention can either be complete or partial.

While the invention has been particularly shown as described with reference to a preferred embodiment, it will be understood by those skilled in the art that various changes in form and detail may be made therein without departing from the spirit and scope of the invention.

What is claimed is:

1. A method of compensating for field effect on a polycrystalline resistor, said method comprising:
   providing a polycrystalline resistor having first and second resistive segments coupled between first and second terminals;
   applying a first voltage to a third terminal A, coupled to the first resistive segment, through which substantially no DC current flows; and
   applying a second voltage to a third terminal B, coupled to the second resistive segment, through which substantially no DC current flows, wherein non-linearity of resistance of the first resistive segment at least partially compensates for non-linearity of resistance of the second resistive segment.

2. The method of claim 1, further comprising:
   spacing the third terminal A from the first resistive segment and spacing the third terminal B from the second resistive segment with an isolation region.

3. The method of claim 1, wherein providing a polycrystalline resistor having first and second resistive segments comprises providing a resistor having first and second resistive segments of approximately a same length.

4. The method of claim 1, wherein providing a polycrystalline resistor having first and second resistive segments comprises providing a resistor having first and second resistive segments of a same length.

5. The method of claim 1, further comprising:
   applying a third voltage to a third terminal C coupled to the first resistive segment; and
   applying a fourth voltage to a third terminal D to the second resistive segment.

6. The method of claim 1, further comprising:
   impeding current leakage between the first resistive segment and the third terminal A utilizing a buffer.

7. The method of claim 1, further comprising:
   coupling the third terminal A to the first resistive segment at an end of the third terminal A; and
   coupling the third terminal B to the second resistive segment at an end of the second terminal B.

8. The method of claim 1, wherein:
   the third terminal A is coupled in series with the third terminal B.

9. The method of claim 1, and further comprising:
   providing a third resistive segment coupled to the first resistive segment and a third terminal C coupled to the third resistive segment, wherein said third terminal C has a third voltage with respect to the first terminal; and
   a length of the third resistive segment is approximately equal to a difference in length of the first and second resistive segments.

* * * * *